United States Patent
Luo et al.

(10) Patent No.: US 10,748,986 B2
(45) Date of Patent: Aug. 18, 2020

(54) STRUCTURE AND FORMATION METHOD OF SEMICONDUCTOR DEVICE WITH CAPACITORS

(71) Applicant: Taiwan Semiconductor Manufacturing Co., Ltd., Hsinchu (TW)

(72) Inventors: Guo-Jyun Luo, Taipei (TW); Shiuan-Jeng Lin, Hsinchu (TW); Chiu-Hua Chung, Hsinchu (TW); Chen-Chien Chang, Zhubei (TW); Han-Zong Pan, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/940,075

(22) Filed: Mar. 29, 2018

(65) Prior Publication Data
US 2019/0157378 A1    May 23, 2019

Related U.S. Application Data

(60) Provisional application No. 62/589,289, filed on Nov. 21, 2017.

(51) Int. Cl.
*H01L 49/02* (2006.01)
*H01L 21/285* (2006.01)
(Continued)

(52) U.S. Cl.
CPC .......... *H01L 28/40* (2013.01); *H01L 21/2855* (2013.01); *H01L 27/0629* (2013.01); *H01L 27/0805* (2013.01)

(58) Field of Classification Search
None
See application file for complete search history.

(56) References Cited

U.S. PATENT DOCUMENTS 5,994,213 A * 11/1999 Wang ............... H01L 21/76882
 204/192.25
6,144,051 A    11/2000 Nishimura et al.
(Continued)

FOREIGN PATENT DOCUMENTS

CN    1635595 A    7/2005
CN    104935294 A   9/2015

OTHER PUBLICATIONS

Li et al. "Relationship of the MLC Internal Electrode Slurry Particle Size and its Normal Temperature Parameters" Electronic Components, second issue, published on Jun. 30, 1992.
(Continued)

*Primary Examiner* — Anthony Ho
*Assistant Examiner* — Kevin Quinto
(74) *Attorney, Agent, or Firm* — Eschweiler & Potashnik, LLC

(57) ABSTRACT

A semiconductor device structure and the formation method thereof are provided. The semiconductor device structure includes a semiconductor substrate and a first capacitor and a second capacitor over the semiconductor substrate. The first capacitor has a first capacitor dielectric layer, and the second capacitor has a second capacitor dielectric layer. The first capacitor dielectric layer is between the second capacitor dielectric layer and the semiconductor substrate. The first capacitor and the second capacitor are electrically connected in parallel. The first capacitor has a first linear temperature coefficient and a first quadratic voltage coefficient. The second capacitor has a second linear temperature coefficient and a second quadratic voltage coefficient. One or both of a first ratio of the first linear temperature coefficient to the second linear temperature coefficient and a second ratio of the first quadratic voltage coefficient to the second quadratic voltage coefficient is negative.

20 Claims, 15 Drawing Sheets

(51) Int. Cl.
   *H01L 27/06* (2006.01)
   *H01L 27/08* (2006.01)

(56) References Cited

U.S. PATENT DOCUMENTS

| | | |
|---|---|---|
| 6,461,914 B1 | 10/2002 | Roberts et al. |
| 2002/0113280 A1 | 8/2002 | Yang et al. |
| 2003/0008470 A1 | 1/2003 | Kitagawa et al. |
| 2004/0046203 A1 | 3/2004 | Morimoto |
| 2005/0082592 A1* | 4/2005 | Chang ............... H01L 23/5223 257/306 |
| 2005/0158924 A1* | 7/2005 | Chakravarti ............ C23C 16/24 438/151 |
| 2005/0245071 A1 | 11/2005 | Wu et al. |
| 2007/0018203 A1 | 1/2007 | Atanackovic et al. |
| 2007/0228506 A1* | 10/2007 | Min ....................... H01G 4/236 257/499 |
| 2012/0211868 A1 | 8/2012 | Stribley et al. |
| 2014/0239448 A1* | 8/2014 | Anderson ............... H01L 28/60 257/534 |
| 2014/0264353 A1* | 9/2014 | Lai .................... H01L 21/02595 257/66 |
| 2015/0021789 A1 | 1/2015 | Lin |
| 2015/0035159 A1 | 2/2015 | Lin et al. |
| 2015/0221713 A1 | 8/2015 | Li et al. |
| 2015/0225841 A1* | 8/2015 | Wilby .................... C23C 14/50 204/192.12 |
| 2016/0104762 A1 | 4/2016 | Triyoso et al. |
| 2017/0011835 A1 | 1/2017 | Savage et al. |
| 2017/0271433 A1 | 9/2017 | Wang et al. |

OTHER PUBLICATIONS

Mackenzie et al. "Stress Control of Si-Based PECVD Dielectrics." Proc. Symp. Silicon Nitride and Silicon Dioxide Thin Insulating Films & Other Emerging Dielectrics VIII, PV2005-01, 148-159, Electrochemical Society, Pennington, NJ (2005). Published May 2005.

* cited by examiner

STRUCTURE AND FORMATION METHOD OF SEMICONDUCTOR DEVICE WITH CAPACITORS

PRIORITY CLAIM AND CROSS-REFERENCE

This Application claims the benefit of U.S. Provisional Application No. 62/589,289, filed on Nov. 21, 2017, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
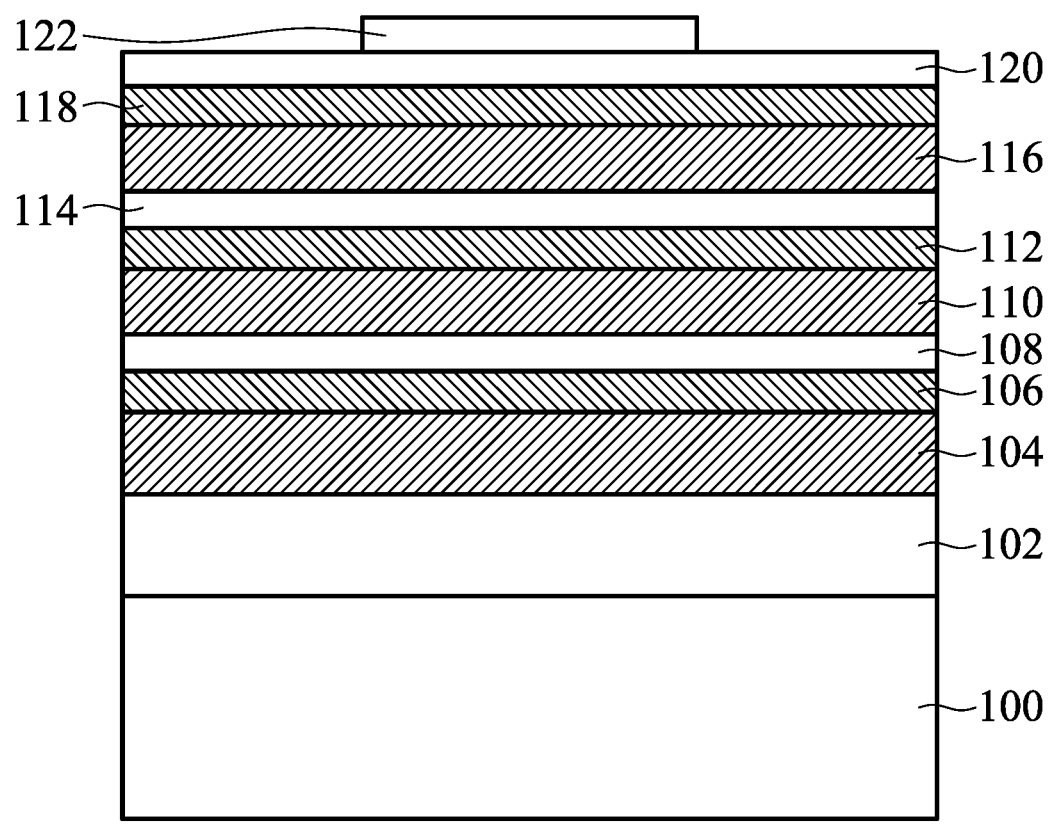
FIGS. 1A-1J are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1J are cross-sectional views of various stages of a process for forming a semiconductor device structure, in accordance with some embodiments. As shown in FIG. 1A, a semiconductor substrate 100 is received or provided. In some embodiments, the semiconductor substrate 100 is a bulk semiconductor substrate, such as a semiconductor wafer. For example, the semiconductor substrate 100 includes silicon or other elementary semiconductor materials such as germanium. In some other embodiments, the semiconductor substrate 100 includes a compound semiconductor. The compound semiconductor may include silicon carbide, gallium arsenide, indium arsenide, indium phosphide, another suitable compound semiconductor, or a combination thereof. In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, isolation features (not shown) are formed in the semiconductor substrate 100 to define and isolate various device elements (not shown) formed in the semiconductor substrate 100. The isolation features include, for example, trench isolation (STI) features or local oxidation of silicon (LOCOS) features.

In some embodiments, various device elements are formed in and/or on the semiconductor substrate 100. Examples of the various device elements that may be formed in the semiconductor substrate 100 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.), diodes, another suitable element, or a combination thereof. Various processes are performed to form the various device elements, such as deposition, etching, implantation, photolithography, annealing, planarization, one or more other applicable processes, or a combination thereof.

In some embodiments, a dielectric layer 102 is formed over the semiconductor substrate 100, as shown in FIG. 1A. The dielectric layer 102 may include multiple sub-layers. The dielectric layer 102 may be made of or include carbon-containing silicon oxide, silicon oxide, borosilicate glass (BSG), phosphoric silicate glass (PSG), borophosphosilicate glass (BPSG), fluorinated silicate glass (FSG), porous dielectric material, another suitable low-k dielectric material, one or more other suitable materials, or a combination thereof.

In some embodiments, multiple conductive features (not shown) are formed in the dielectric layer 102. The conductive features may include conductive contacts, conductive lines, and/or conductive vias. The dielectric layer 102 and the conductive features formed therein are a portion of an interconnection structure that will be subsequently formed. The formation of the dielectric layer 102 and the conductive features in the dielectric layer 102 may involve multiple deposition processes, patterning processes, and planarization processes. The device elements in and/or on the semiconductor substrate 100 will be interconnected through the interconnection structure to be formed over the semiconductor substrate 100.

As shown in FIG. 1A, a conductive layer 104 is deposited over the dielectric layer 102, in accordance with some embodiments. The conductive layer 104 will then be patterned to form a lower electrode of a capacitor element. In some embodiments, the conductive layer 104 is made of or includes copper, aluminum, gold, titanium, platinum, one or more other suitable materials, or a combination thereof. For example, the conductive layer 104 is made of aluminum-copper alloy (AlCu). In some embodiments, the conductive layer 104 has a thickness that is in a range from about 2000 nm to about 5000 nm. The conductive layer 104 may be deposited using a physical vapor deposition (PVD) process, a chemical vapor deposition (CVD) process, an electroplating process, an electroless plating process, one or more other applicable processes, or a combination thereof.

As shown in FIG. 1A, a barrier layer 106 is deposited over the conductive layer 104, in accordance with some embodiments. The barrier layer 106 may be used to prevent metal ions of the conductive layer 104 from diffusing into other material layers that will be formed. For example, the barrier layer 106 may prevent the metal ions of the conductive layer 104 from diffusing into a capacitor dielectric layer that will be formed on the barrier layer 106.

The barrier layer 106 may be made of or include titanium nitride, tantalum nitride, one or more other suitable materials, or a combination thereof. The barrier layer 106 may have a thickness that is in a range from about 500 nm to about 800 nm. The barrier layer 106 may be deposited using a PVD process, a CVD process, one or more other applicable processes, or a combination thereof.

However, many variations and/or modifications can be made to embodiments of the disclosure. In some other embodiments, the barrier layer 106 is not formed.

As shown in FIG. 1A, a capacitor dielectric layer 108 is deposited over the barrier layer 106, in accordance with some embodiments. The capacitor dielectric layer 108 may be made of or include an oxide material (such as silicon oxide or germanium oxide), a nitride material (such as silicon nitride or germanium nitride), one or more other suitable materials, or a combination thereof. In some other embodiments, the capacitor dielectric layer 108 is made of or includes silicon oxynitride, silicon carbide, silicon oxycarbide, silicon oxide, silicon nitride, tantalum oxide, one or more other suitable materials, or a combination thereof. In some embodiments, the capacitor dielectric layer 108 is made of or includes an oxide material with compressive stress. For example, the capacitor dielectric layer 108 may be made of silicon oxide with compressive stress that is in a range from about −250 MPa to about −300 MPa. In some other embodiments, the capacitor dielectric layer 108 is made of or includes a nitride material with tensile stress. For example, the capacitor dielectric layer 108 may be made of silicon nitride with tensile stress that is in a range from about 250 MPa to about 300 MPa. The capacitor dielectric layer 108 may be deposited using a CVD process, a PVD process, an atomic layer deposition (ALD) process, one or more other applicable processes, or a combination thereof. In some embodiments, the capacitor dielectric layer 108 has a thickness that is in a range from about 250 Å to about 400 Å. In some other embodiments, the capacitor dielectric layer 108 has a thickness that is in a range from about 300 Å to about 350 Å.

Afterwards, a conductive layer 110 is deposited over the capacitor dielectric layer 108, as shown in FIG. 1A in accordance with some embodiments. The conductive layer 110 will then be patterned to form an electrode of capacitor elements that are electrically connected together in parallel. The electrode may serve as an electrode of a lower capacitor element and at the same time serve as an electrode of an upper capacitor element.

In some embodiments, the conductive layer 110 is made of or includes copper, aluminum, gold, titanium, platinum, one or more other suitable materials, or a combination thereof. For example, the conductive layer 110 is made of aluminum-copper alloy (AlCu). In some embodiments, the conductive layer 110 is thinner than the conductive layer 104. In some embodiments, the conductive layer 110 has a thickness that is in a range from about 300 nm to about 800 nm. The conductive layer 110 may be deposited using a physical vapor deposition (PVD) process, a chemical vapor deposition (CVD) process, an electroplating process, an electroless plating process, one or more other applicable processes, or a combination thereof.

As shown in FIG. 1A, a barrier layer 112 is deposited over the conductive layer 110, in accordance with some embodiments. The barrier layer 112 may be used to prevent metal ions of the conductive layer 110 from diffusing into other material layers that will be formed. For example, the barrier layer 112 may prevent the metal ions of the conductive layer 110 from diffusing into a capacitor dielectric layer that will be formed on the barrier layer 112.

The barrier layer 112 may be made of or include titanium nitride, tantalum nitride, one or more other suitable materials, or a combination thereof. The barrier layer 112 may have a thickness that is in a range from about 200 nm to about 500 nm. The barrier layer 112 may be deposited using a PVD process, a CVD process, one or more other applicable processes, or a combination thereof.

However, many variations and/or modifications can be made to embodiments of the disclosure. In some other embodiments, the barrier layer 112 is not formed.

As shown in FIG. 1A, a capacitor dielectric layer 114 is deposited over the barrier layer 112, in accordance with some embodiments. The capacitor dielectric layer 114 may be made of or include an oxide material (such as silicon oxide), a nitride material (such as silicon nitride), one or more other suitable materials, or a combination thereof. In some embodiments, the capacitor dielectric layer 114 and the capacitor dielectric layer 108 are made of different materials.

In some embodiments, the capacitor dielectric layer 114 is made of or includes a nitride material with tensile stress. For example, the capacitor dielectric layer 114 may be made of silicon nitride with tensile stress that is in a range from about 250 MPa to about 300 MPa. In some other embodiments, the capacitor dielectric layer 114 is made of or includes an oxide material with compressive stress. For example, the capacitor dielectric layer 114 may be made of silicon oxide with compressive stress that is in a range from about −250 MPa to about −300 MPa. In some embodiments, the capacitor dielectric layer 114 is made of or includes a nitride material with tensile stress, and the capacitor dielectric layer 108 is made of or includes an oxide material with compressive stress. In some other embodiments, the capacitor dielectric layer 108 is made of or includes a nitride material with tensile stress, and the capacitor dielectric layer 114 is made of or includes an oxide material with compressive stress. In some other embodiments, the capacitor dielectric layer 114 is made of or includes silicon oxynitride, silicon carbide, silicon oxycarbide, silicon oxide, silicon nitride, tantalum oxide, one or more other suitable materials, or a combination thereof. The capacitor dielectric layer 114 may be deposited using a CVD process, a PVD process, an atomic layer deposition (ALD) process, one or more other applicable processes, or a combination thereof. In some embodiments, the capacitor dielectric layer 114 has a thickness that is in a range from about 250 Å to about 400 Å. In some other embodiments, the capacitor dielectric layer 114 has a thickness that is in a range from about 300 Å to about 350 Å.

Afterwards, a conductive layer 116 is deposited over the capacitor dielectric layer 114, as shown in FIG. 1A in accordance with some embodiments. The conductive layer 116 will then be patterned to form an electrode of a capacitor element. In some embodiments, the conductive layer 116 is made of or includes copper, aluminum, gold, titanium, platinum, one or more other suitable materials, or a combination thereof. For example, the conductive layer 116 is made of aluminum-copper alloy (AlCu). In some embodiments, the conductive layer 116 is thinner than the conductive layer 104. In some embodiments, the conductive layer 116 has a thickness that is in a range from about 300 nm to about 800 nm. The conductive layer 116 may be deposited using a physical vapor deposition (PVD) process, a chemical vapor deposition (CVD) process, an electroplating process, an electroless plating process, one or more other applicable processes, or a combination thereof.

As shown in FIG. 1A, a barrier layer 118 is deposited over the conductive layer 116, in accordance with some embodiments. The barrier layer 118 may be used to prevent metal ions of the conductive layer 116 from diffusing into other material layers that will be formed. The barrier layer 118 may be made of or include titanium nitride, tantalum nitride, one or more other suitable materials, or a combination thereof. The barrier layer 118 may have a thickness that is in a range from about 200 nm to about 500 nm. In some other embodiments, the barrier layer 118 is thicker than the barrier layer 112. In some embodiments, the barrier layer 118 would suffer a heavier etching process than the barrier layer 112. Therefore, if the barrier layer 118 has a greater thickness, the barrier layer 118 may be prevented from being completely etched through, which ensuring the quality of the semiconductor device structure. The barrier layer 118 may be deposited using a PVD process, a CVD process, one or more other applicable processes, or a combination thereof.

However, many variations and/or modifications can be made to embodiments of the disclosure. In some other embodiments, the barrier layer 118 is not formed.

As shown in FIG. 1A, an anti-reflection layer 120 is deposited over the barrier layer 118, in accordance with some embodiments. The anti-reflection layer 120 may be used to assist in subsequent patterning processes. The anti-reflection layer 120 may be made of or include a carbon-containing material (such as a polymer material), a nitride material (such as silicon oxynitride or titanium nitride), one or more other suitable materials, or a combination thereof. The anti-reflection layer 120 may be deposited using a CVD process, a spin-on process, a spray coating process, one or more other applicable processes, or a combination thereof.

Afterwards, a mask layer 122 is formed over the anti-reflection layer 120, as shown in FIG. 1A in accordance with some embodiments. The mask layer 122 may be a patterned photoresist layer. The mask layer 122 defines the pattern to be transferred to the conductive layer 116 and the capacitor dielectric layer 114. One or more photolithography processes may be used to form the mask layer 122.

Figure 1B:
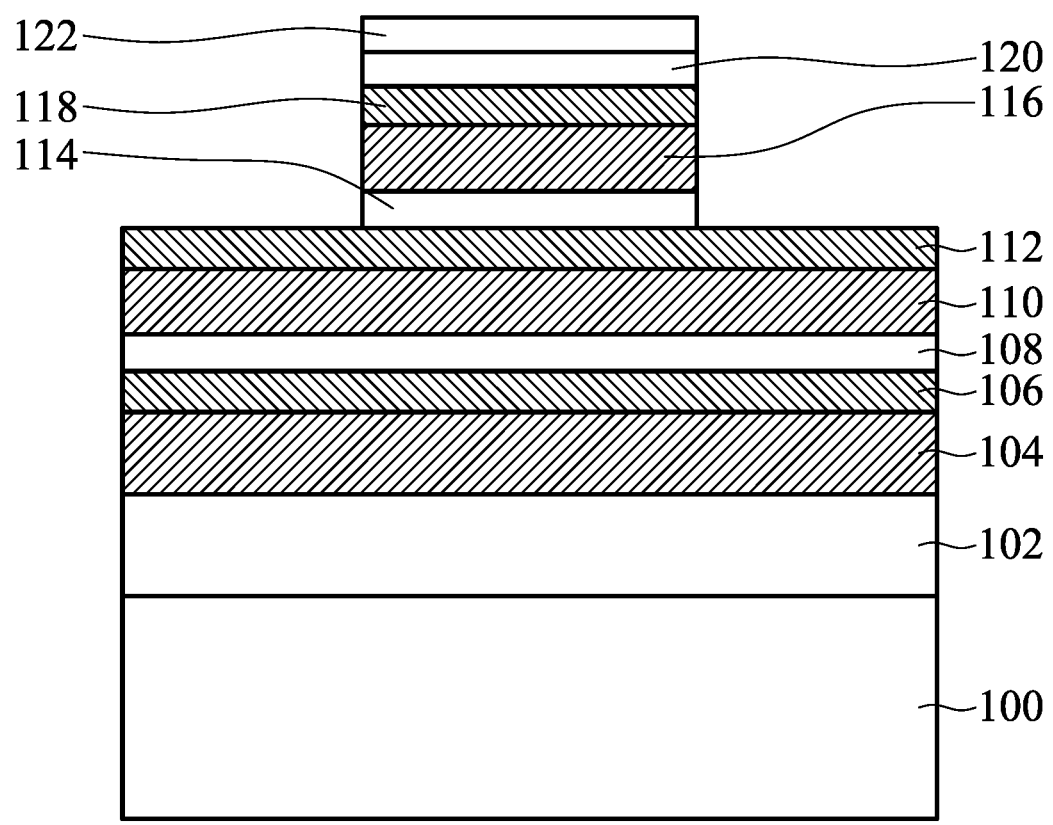

As shown in FIG. 1B, the anti-reflection layer 120, the barrier layer 118, the conductive layer 116 and the capacitor dielectric layer 114 are partially removed, in accordance with some embodiments. These layers may be partially removed using one or more etching processes. As a result, the conductive layer 116 is patterned and is used as an upper electrode. The mask layer 122 may serve as an etching mask during the one or more etching processes. The one or more etching processes may include a dry etching process, a wet etching process, or a combination thereof. The barrier layer 112 may serve as an etch stop layer during the etching process for patterning the anti-reflection layer 120, the barrier layer 118, the conductive layer 116 and the capacitor dielectric layer 114.

Afterwards, the mask layer 122 is removed after the one or more etching processes in some embodiments. In some other embodiments, the mask layer 122 is consumed during the one or more etching processes.

Figure 1C:
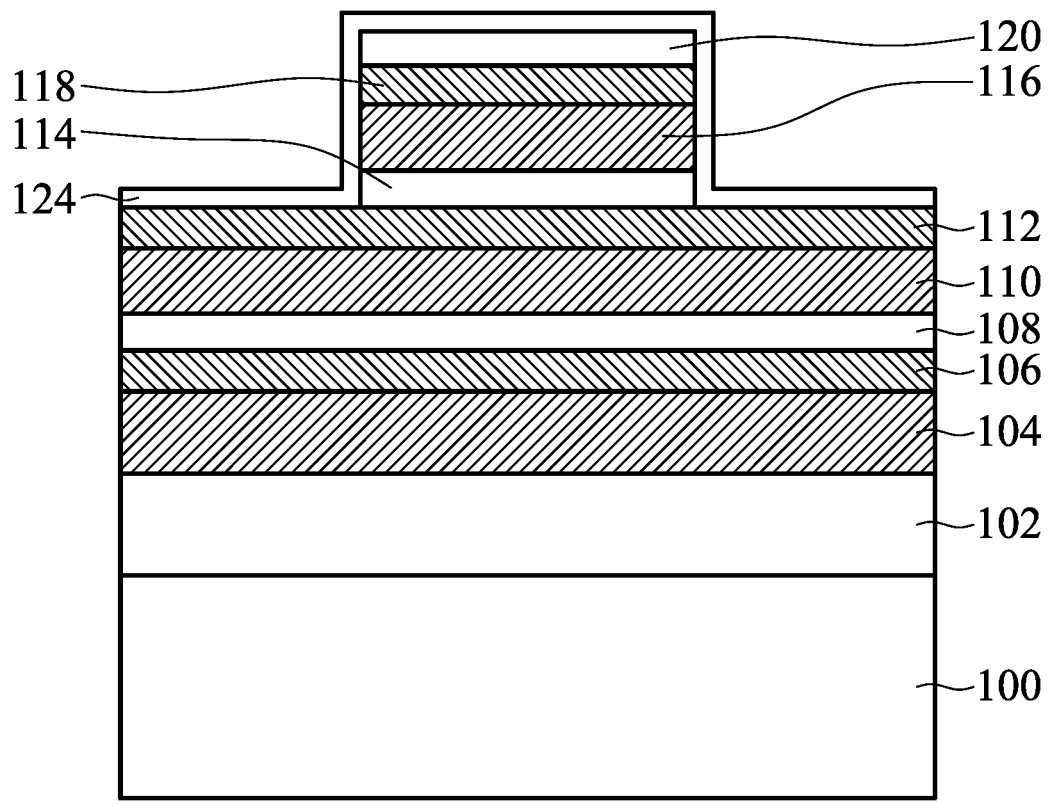

As shown in FIG. 1C, a protection layer 124 is formed over sidewalls of the capacitor dielectric layer 114, sidewalls of the conductive layer 116, and sidewalls of the barrier layer 118, in accordance with some embodiments. The protection layer 124 may prevent metal material from being re-sputtered onto the sidewalls of the capacitor dielectric layer 114, the conductive layer 116, and the barrier layer 118 during subsequent patterning processes. Therefore, short-circuiting may be prevented or reduced. In some embodiments, the protection layer 124 extends further on the top surface of the barrier layer 112, the sidewalls of the anti-reflection layer 120, and the top surface of the anti-reflection layer 120, as shown in FIG. 1C. In some embodiments, the protection layer 124 is in direct contact with the anti-reflection layer 120, the barrier layer 118, the conductive layer 116, the capacitor dielectric layer 114 and/or the barrier layer 112. In some embodiments, the protection layer 124 extends on these layers in a conformal manner.

In some embodiments, the protection layer 124 is a single layer. In some other embodiments, the protection layer 124 includes multiple sub-layers. In some embodiments, some of the sub-layers are made of different materials. In some other embodiments, these sub-layers are made of the same material. In some embodiments, the protection layer 124 is made of or includes silicon oxide, silicon nitride, silicon oxynitride, silicon carbide, one or more other suitable materials, or a combination thereof. The protection layer 124 may be deposited using a CVD process, an ALD process, one or more other applicable processes, or a combination thereof.

However, many variations and/or modifications can be made to embodiments of the disclosure. In some other embodiments, the protection layer 124 is not formed.

Figure 1D:
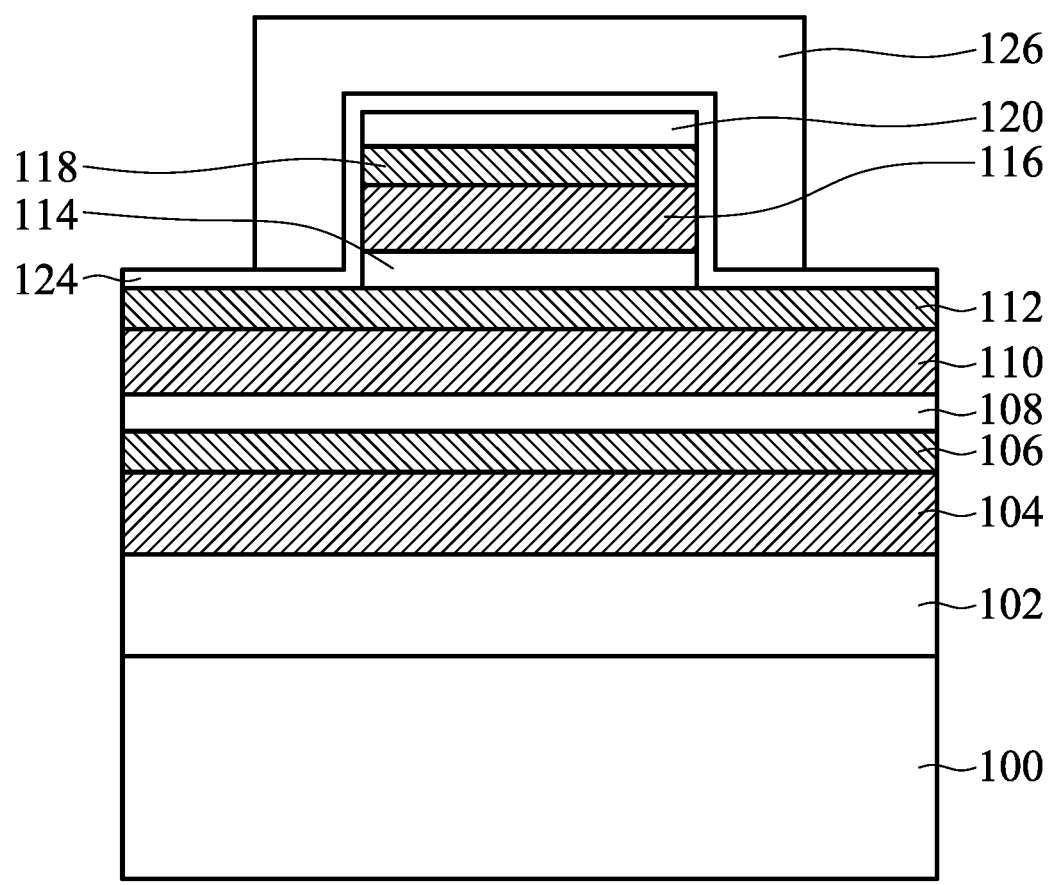

As shown in FIG. 1D, a mask layer 126 is formed over the protection layer 124, as shown in FIG. 1D in accordance with some embodiments. The mask layer 126 may be a patterned photoresist layer. The mask layer 126 defines the pattern to be transferred to the conductive layer 110 and the capacitor dielectric layer 108. One or more photolithography processes may be used to form the mask layer 126.

Figure 1E:
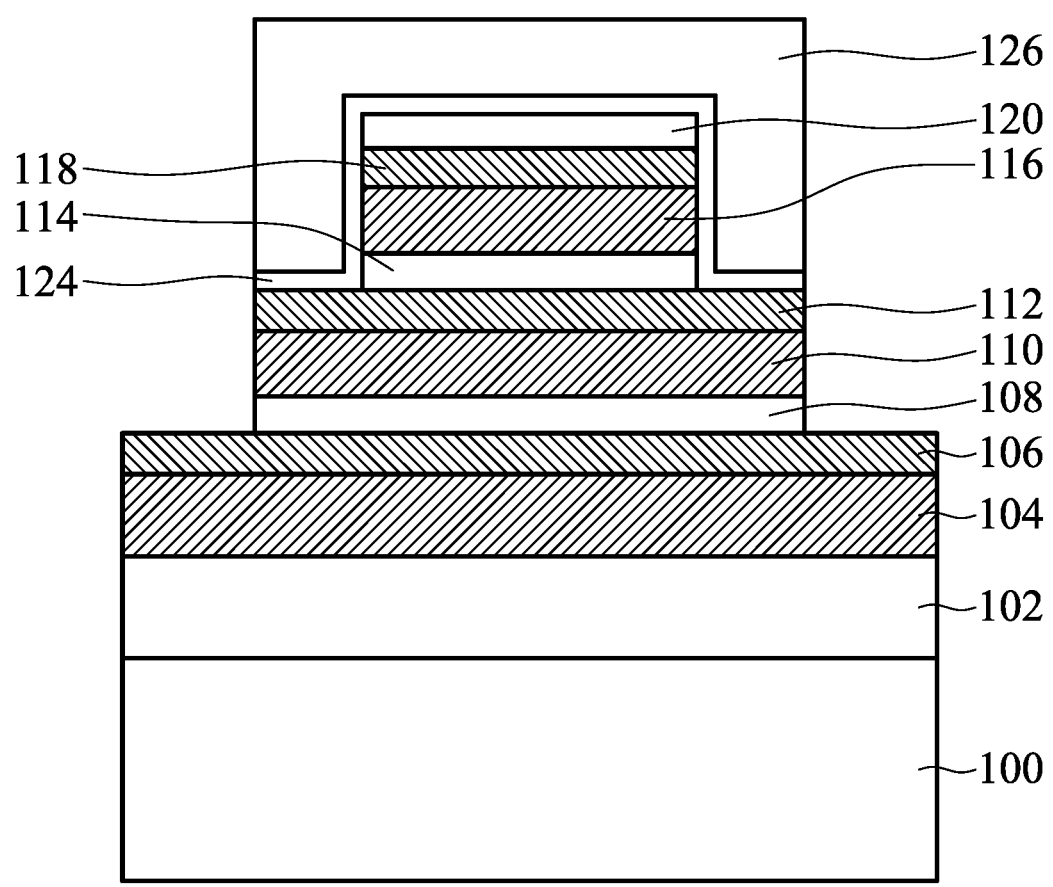

As shown in FIG. 1E, the barrier layer 112, the conductive layer 110 and the capacitor dielectric layer 108 are partially removed, in accordance with some embodiments. These layers may be partially removed using one or more etching processes. As a result, the conductive layer 110 is patterned and is used as an intermediate electrode. The mask layer 126 may serve as an etching mask during the one or more etching processes. The one or more etching processes may include a dry etching process, a wet etching process, or a combination thereof. The barrier layer 106 may serve as an etch stop layer during the etching process for patterning the barrier layer 112, the conductive layer 110 and the capacitor dielectric layer 108.

During the one or more etching processes, the metal material of the conductive layer 110 is prevented from being re-sputtered onto the sidewalls of the capacitor dielectric layer 114, the conductive layer 116, and/or the barrier layer 118 due to the protection layer 124. Therefore, short-circuiting may be prevented or reduced. The quality and reliability of the semiconductor device structure are improved.

Figure 1F:
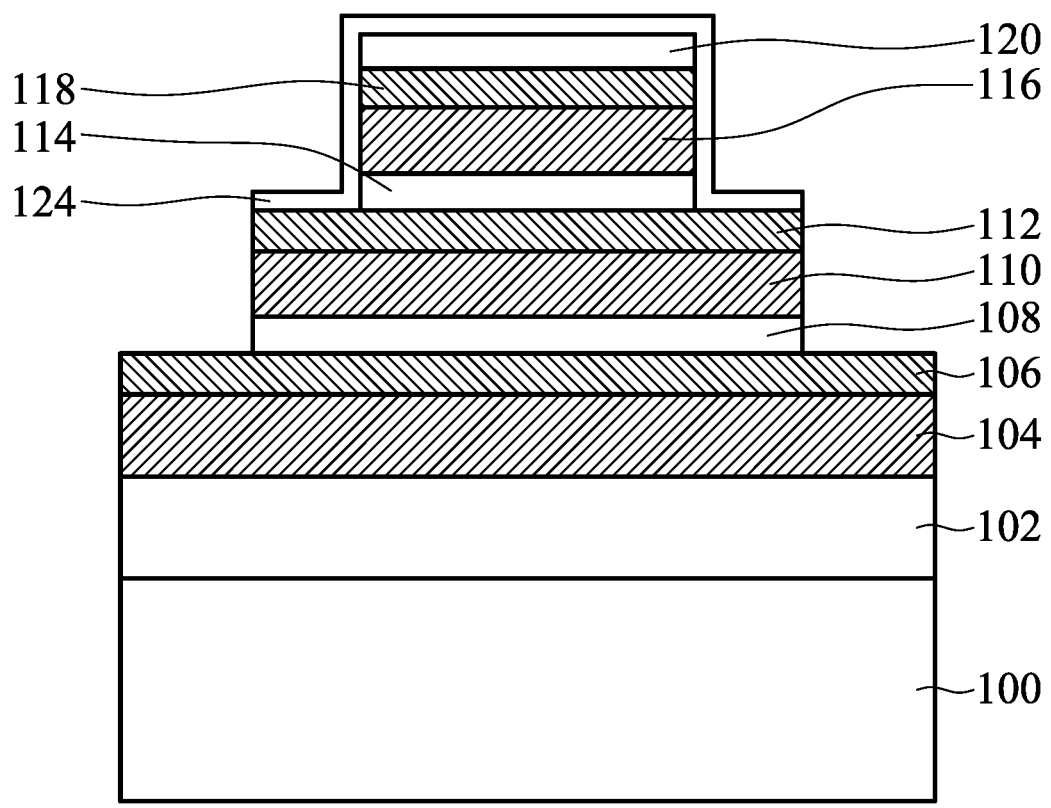

Afterwards, the mask layer 126 is removed after the one or more etching processes, as shown in FIG. 1F in accordance with some embodiments. In some other embodiments, the mask layer 126 is consumed during the one or more etching processes.

Figure 1G:
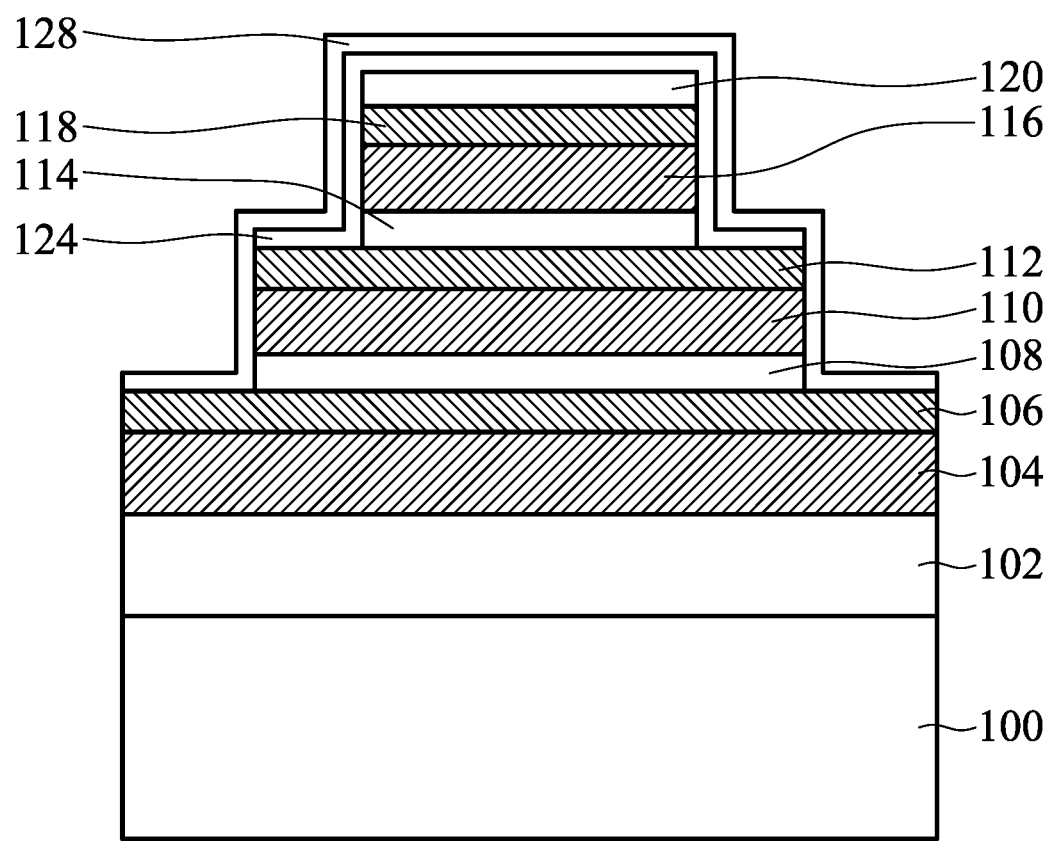

As shown in FIG. 1G, a protection layer 128 is formed over sidewalls of the capacitor dielectric layer 108, sidewalls of the conductive layer 110, and sidewalls of the barrier layer 112, in accordance with some embodiments. The protection layer 128 may prevent metal material from being re-sputtered onto the sidewalls of the capacitor dielectric layer 108, the conductive layer 110, and the barrier layer 112 during subsequent patterning processes. Therefore, short-circuiting may be prevented or reduced. In some embodiments, the protection layer 128 extends further on the protection layer 124 and the top surface of the barrier layer 106, as shown in FIG. 1G. In some embodiments, the protection layer 128 is in direct contact with the protection layer 124, the barrier layer 112, the conductive layer 110, the capacitor dielectric layer 108 and/or the barrier layer 106. In some embodiments, the protection layer 128 extends on these layers in a conformal manner.

In some embodiments, the protection layer 128 is a single layer. In some other embodiments, the protection layer 128 includes multiple sub-layers. In some embodiments, some of the sub-layers are made of different materials. In some other embodiments, these sub-layers are made of the same material. In some embodiments, the protection layer 128 is made of or includes silicon oxide, silicon nitride, silicon oxynitride, silicon carbide, one or more other suitable materials, or a combination thereof. The protection layer 128 may be deposited using a CVD process, an ALD process, one or more other applicable processes, or a combination thereof.

However, many variations and/or modifications can be made to embodiments of the disclosure. In some other embodiments, the protection layer 128 is not formed.

Figure 1H:
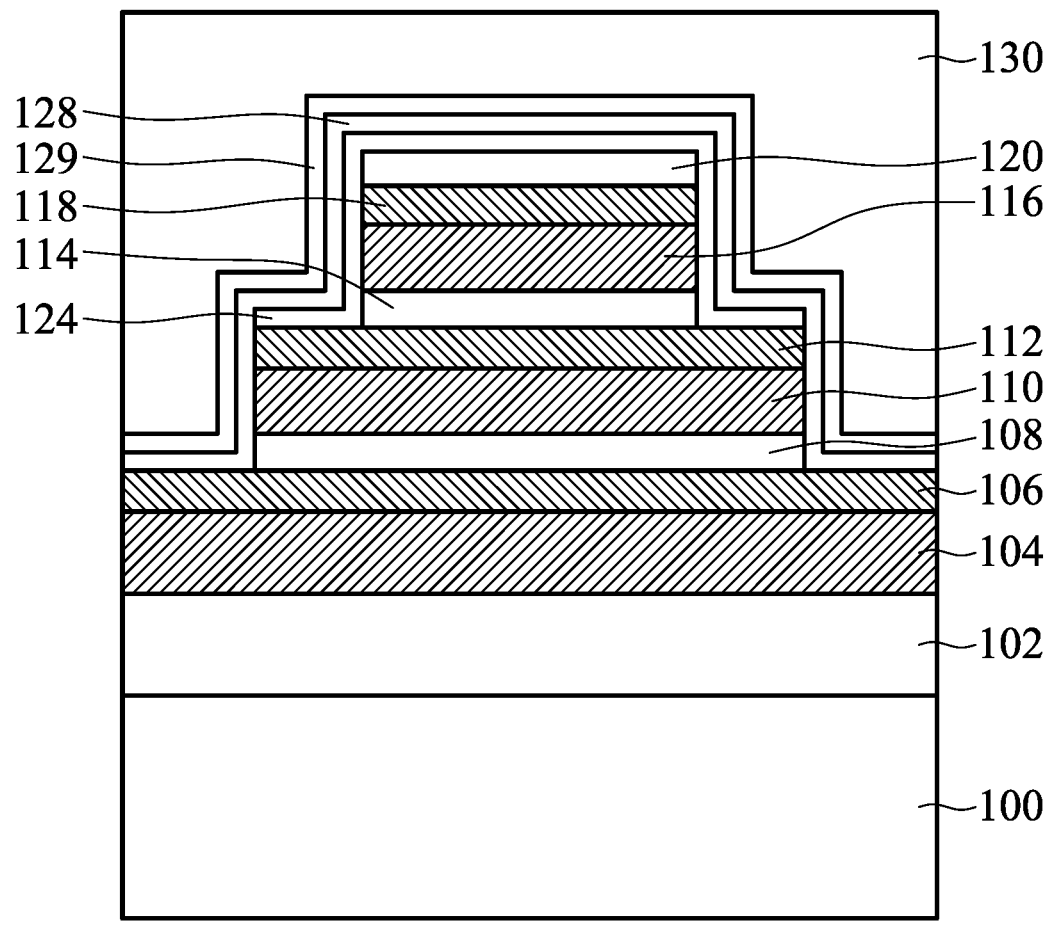

As shown in FIG. 1H, an anti-reflection layer 129 is deposited over the barrier layer 118, in accordance with some embodiments. The anti-reflection layer 129 may be used to assist in subsequent patterning processes. The anti-reflection layer 129 may be made of or include a carbon-containing material (such as a polymer material), a nitride material (such as silicon oxynitride or titanium nitride), one or more other suitable materials, or a combination thereof. The anti-reflection layer 129 may be deposited using a CVD process, a spin-on process, a spray coating process, one or more other applicable processes, or a combination thereof.

Afterwards, a mask layer 130 is formed over the anti-reflection layer 129, as shown in FIG. 1H in accordance with some embodiments. The mask layer 130 may be a patterned photoresist layer. The mask layer 130 defines the pattern to be transferred to the conductive layer 104 and the barrier layer 106. One or more photolithography processes may be used to form the mask layer 130.

Afterwards, the anti-reflection layer 129, the barrier layer 106, and the conductive layer 104 are partially removed, in accordance with some embodiments. These layers may be partially removed using one or more etching processes. As a result, the conductive layer 104 is patterned and is used as a lower electrode. The mask layer 130 may serve as an etching mask during the one or more etching processes. The one or more etching processes may include a dry etching process, a wet etching process, or a combination thereof.

Figure 1I:
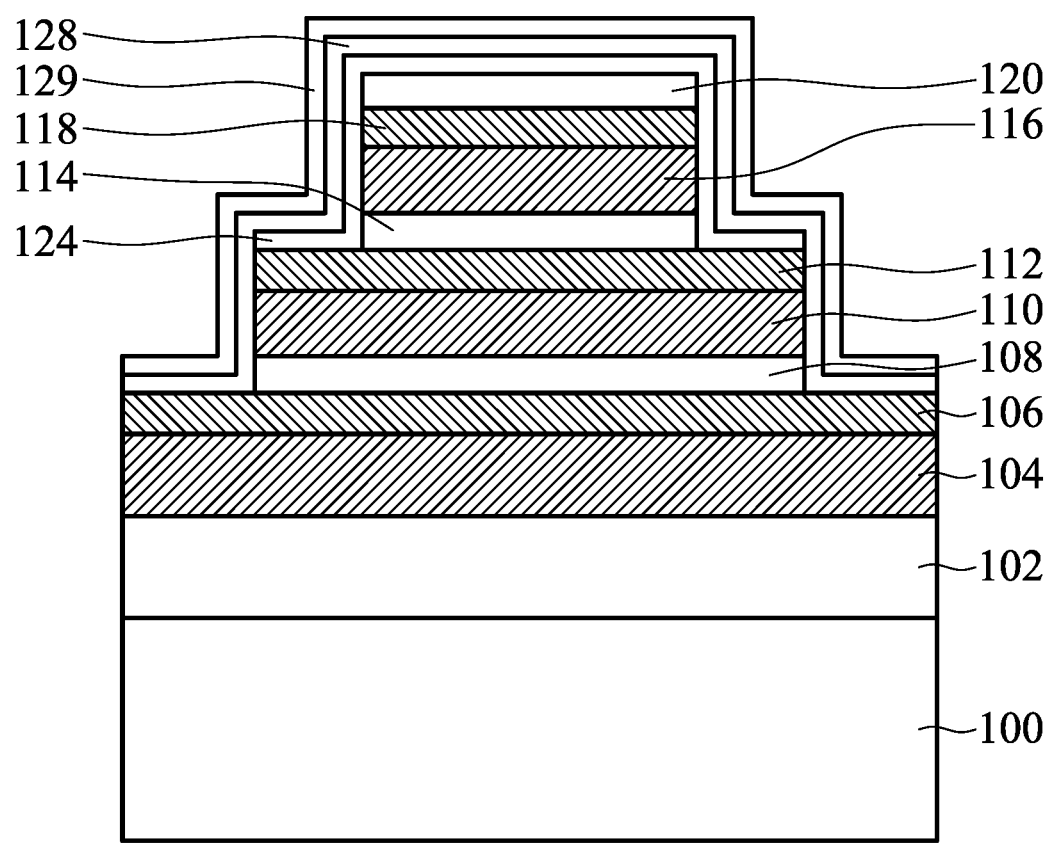

As shown in FIG. 1I, the mask layer 130 is removed after the one or more etching processes, in accordance with some embodiments. In some other embodiments, the mask layer 130 is consumed during the one or more etching processes.

Figure 1J:
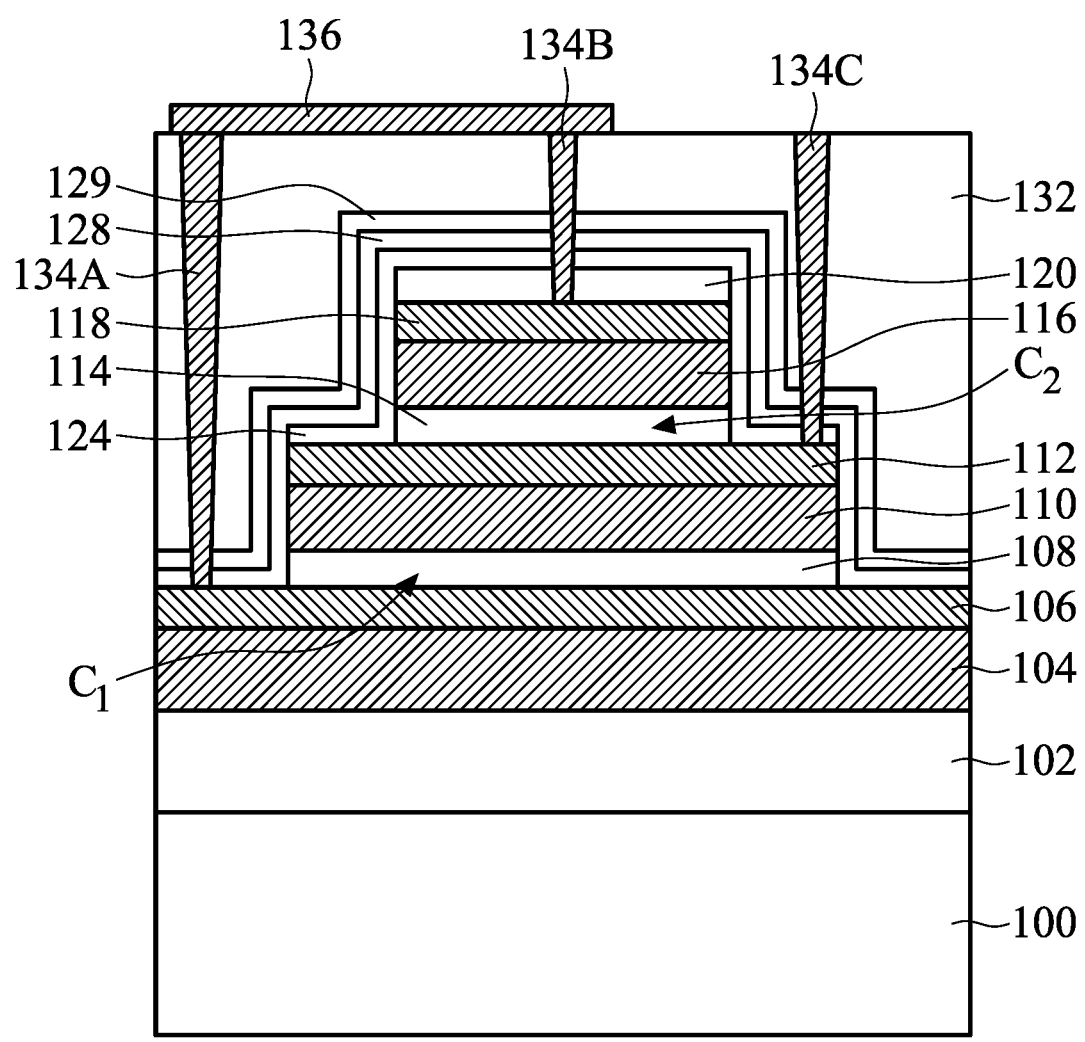

As shown in FIG. 1J, a dielectric layer 132 is deposited over the structure shown in FIG. 1I, in accordance with some embodiments. The dielectric layer 132 may be made of or include carbon-containing silicon oxide, silicon oxide, borosilicate glass (BSG), phosphoric silicate glass (PSG), borophosphosilicate glass (BPSG), fluorinated silicate glass (FSG), porous dielectric material, another suitable low-k dielectric material, one or more other suitable materials, or a combination thereof. The dielectric layer 132 may be deposited using a CVD process, an ALD process, a PVD process, a spin-on process, one or more other applicable processes, or a combination thereof.

Afterwards, conductive structures 134A, 134B, and 134C are formed in the dielectric layer 132, as shown in FIG. 1J in accordance with some embodiments. The conductive structure 134A is electrically connected to the conductive layer 104 (i.e., the lower electrode) and the barrier layer 106. The conductive structure 134B is electrically connected to the conductive layer 116 (i.e., the upper electrode) and the barrier layer 118. The conductive structure 134C is electrically connected to the conductive layer 110 (i.e., the intermediate electrode) and the barrier layer 112. In some embodiments, the conductive structures 134A, 134B, and 134C are conductive vias.

In some embodiments, the conductive structures 134A, 134B, and 134C are made of or include copper, tungsten, aluminum, cobalt, titanium, gold, platinum, one or more other suitable materials, or a combination thereof. In some embodiments, one or more photolithography processes and etching processes are used to form via holes that expose the barrier layers 106, 118, and 112. In some embodiments, because the barrier layer 118 is thicker than the barrier layer 112, the conductive layer 116 under the barrier layer 118 is prevented from being damaged during the etching process for forming the via holes. In some other embodiments, one or some of the via holes further expose the conductive layer under the barrier layer.

Afterwards, these via holes are filled with one or more conductive materials to form the conductive structures 134A, 134B, and 134C. The conductive material may be formed using a CVD process, a PVD process, an electroplating process, an electroless plating process, one or more other applicable processes, or a combination thereof.

In some embodiments, a barrier layer is formed before the formation of the conductive material. The barrier layer may be used to prevent metal ions of the conductive material from diffusing into the dielectric layer 132. The barrier layer may be made of or include titanium nitride, tantalum nitride, one or more other suitable materials, or a combination thereof. The barrier layer may be deposited using a PVD process, a CVD process, one or more other applicable processes, or a combination thereof.

However, many variations and/or modifications can be made to embodiments of the disclosure. In some other embodiments, the barrier layer is not formed.

As shown in FIG. 1J, a conductive structure 136 is formed over the dielectric layer 132, in accordance with some embodiments. The conductive structure 136 electrically connects the conductive structure 134A and the conductive structure 134B. In some embodiments, the conductive structure 136 is a conductive line. The conductive structure 136 may be made of or include copper, tungsten, aluminum, cobalt, titanium, gold, platinum, one or more other suitable materials, or a combination thereof. The formation of the conductive structure 136 may involve a CVD process, a PVD process, an electroplating process, an electroless plating process, one or more other applicable processes, or a combination thereof.

In some embodiments, the conductive structure 136 is formed in a trench of a dielectric layer. In some embodiments, the conductive structure 136 and the conductive structures 134A, 134B, and 134C are formed in a dielectric layer using a dual damascene process.

In some embodiments, the conductive layer 104, the capacitor dielectric layer 108, and the conductive layer 110 together form a portion of a capacitor $C_1$. In some embodiments, the conductive layer 110, the capacitor dielectric layer 114, and the conductive layer 116 together form a portion of a capacitor $C_2$. In some embodiments, the capacitor $C_1$ and the capacitor $C_2$ are electrically connected together in parallel through the conductive structures 134A, 136, 134B, and 134C.

Figure 2:
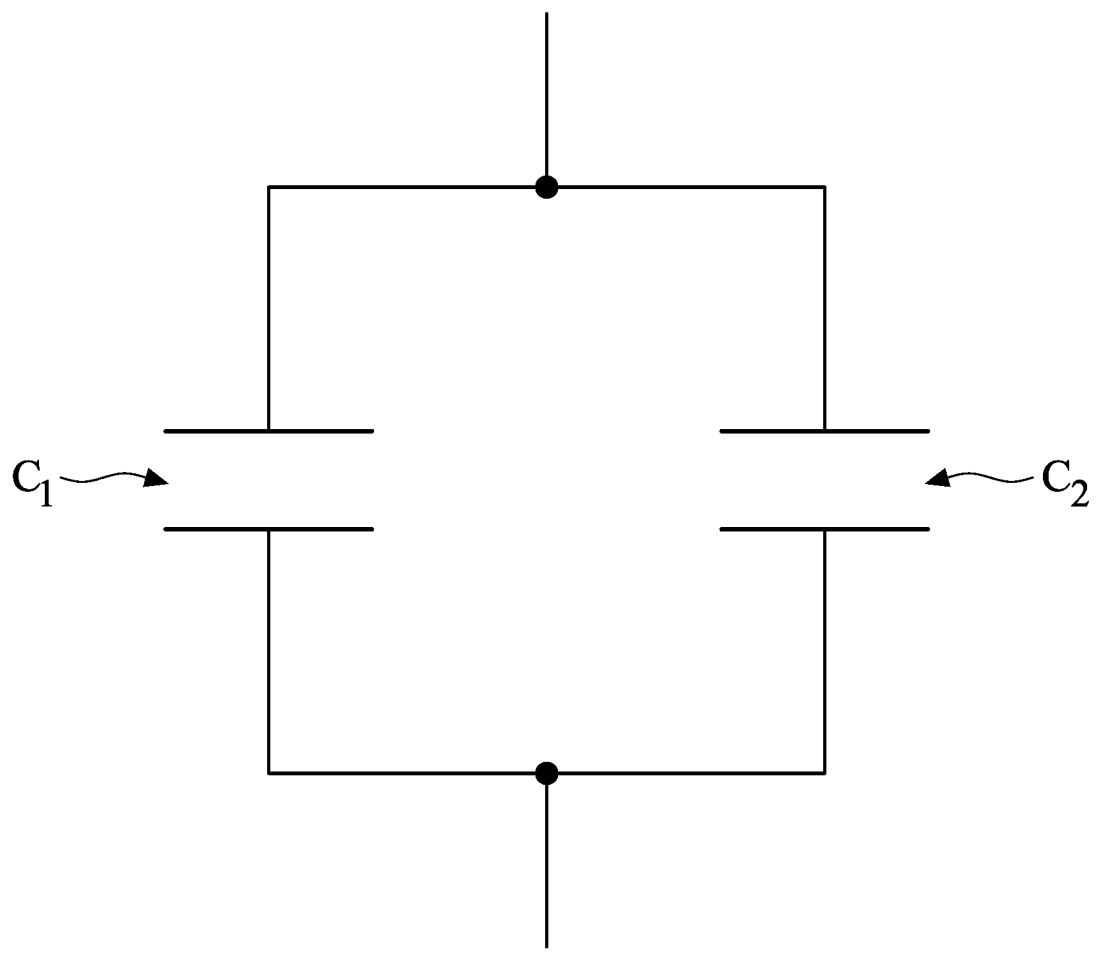
FIG. 2 is a circuit diagram of a semiconductor device structure, in accordance with some embodiments.

FIG. 2 is a circuit diagram of a semiconductor device structure, in accordance with some embodiments. In some embodiments, FIG. 2 shows the corresponding circuit diagram of the semiconductor device structure in FIG. 1J. As shown in FIG. 2, the capacitor $C_1$ and the capacitor $C_2$ are electrically connected together in parallel. The equivalent capacitance is the sum of the capacitance of the capacitor $C_1$ and that of the capacitor $C_2$. For example, if the capacitor $C_1$ has a capacitance of "A" and the capacitor $C_2$ has a capacitance of "B", the equivalent capacitance of the capacitors $C_1$ and $C_2$ that are electrically connected in parallel would be equal to "A+B". Greater capacitance may be achieved without taking up too much of the die area. In some embodiments, the capacitors $C_1$ and $C_2$ are stacked together. The occupied die area is small. The obtained capacitance may be improved (or even doubled) by using the same area on the wafer.

In some embodiments, the capacitance of a capacitor is dependent to the operation temperature. At different operation temperatures, the capacitance of the same capacitor may be different. The capacitor has temperature coefficients. The temperature coefficients may be obtained by measuring the capacitance at different operation temperatures, then fit to the equation as follows:

$$C(T)=C_T(0)\times[1+(T\times A_T)+T^2\times B_T)],$$

wherein "C(T)" is the specific capacitance at a given operation temperature, "$C_T(0)$" is the capacitance of the capacitor at an operation temperature of 25 degrees C., "$A_T$" is the linear temperature coefficient, and "$B_T$" is the quadratic temperature coefficient. In some embodiments, the linear temperature coefficient ($A_T$) is much greater than the quadratic temperature coefficient ($B_T$).

Figure 3A:
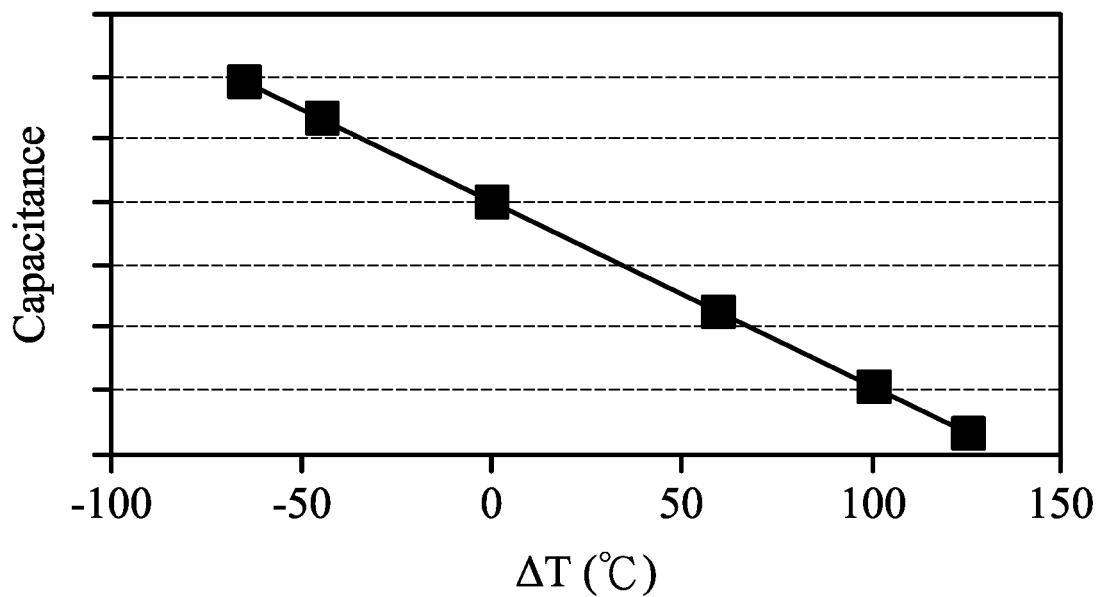
FIG. 3A shows the capacitance of a capacitor at different operation temperatures, in accordance with some embodiments.

The capacitor dielectric layer with different materials may have different linear temperature coefficients. In some embodiments, the capacitor dielectric layer is an oxide material with compressive stress (such as silicon oxide with compressive stress). In these cases, the capacitor with the capacitor dielectric layer mentioned above has a negative linear temperature coefficient. FIG. 3A shows the capacitance of a capacitor at different operation temperatures, in accordance with some embodiments. In some embodiments, the capacitance of the capacitor decreases as the operation temperature increases. The linear temperature coefficient is negative.

Figure 3B:
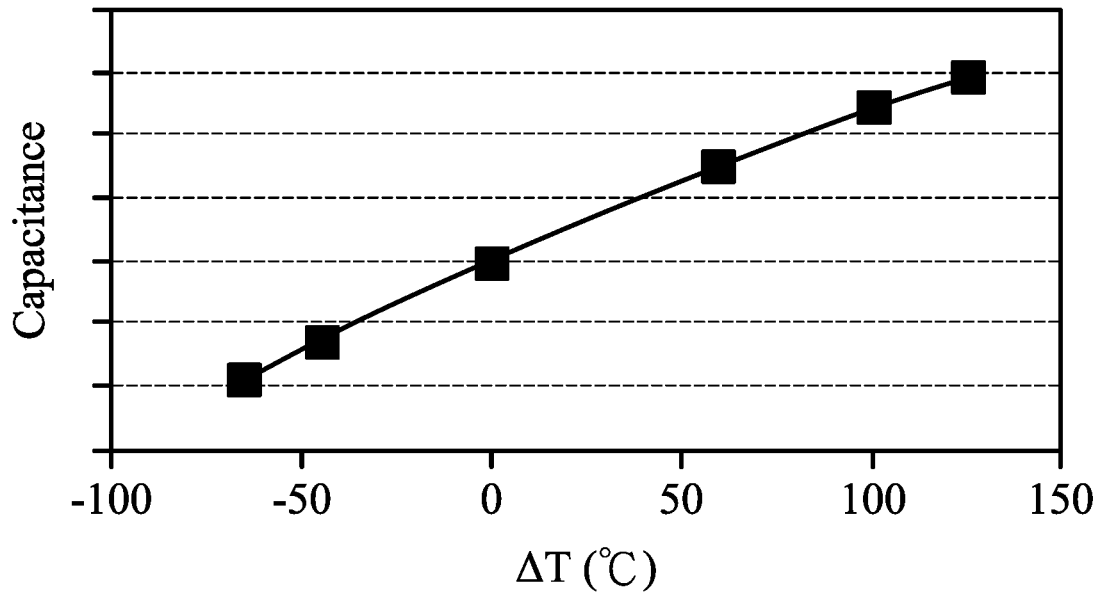
FIG. 3B shows the capacitance of a capacitor at different operation temperatures, in accordance with some embodiments.

In some other embodiments, the capacitor dielectric layer is a nitride material with tensile stress (such as silicon nitride with tensile stress). In these cases, the capacitor with the capacitor dielectric layer mentioned above has a positive linear temperature coefficient. FIG. 3B shows the capacitance of a capacitor at different operation temperatures, in accordance with some embodiments. In some embodiments, the capacitance of the capacitor increases as the operation temperature increases. The linear temperature coefficient is positive.

In some embodiments, the capacitance of a capacitor is dependent to the applied voltage. Under different operation voltage, the capacitance of the same capacitor may be different. The capacitor has voltage coefficients. The voltage coefficients may be obtained by measuring the capacitance at different operation voltages, then fit to the equation as follows:

$$C(V)=C_V(0)\times[1+(V\times A_V)+V^2\times B_V)],$$

wherein "C(V)" is the specific capacitance at a given operation voltage, "$C_V(0)$" is the capacitance of the capacitor at an operation voltage of 0 volt, "$A_V$" is the linear voltage coefficient, and "$B_V$" is the quadratic voltage coefficient.

Figure 4A:
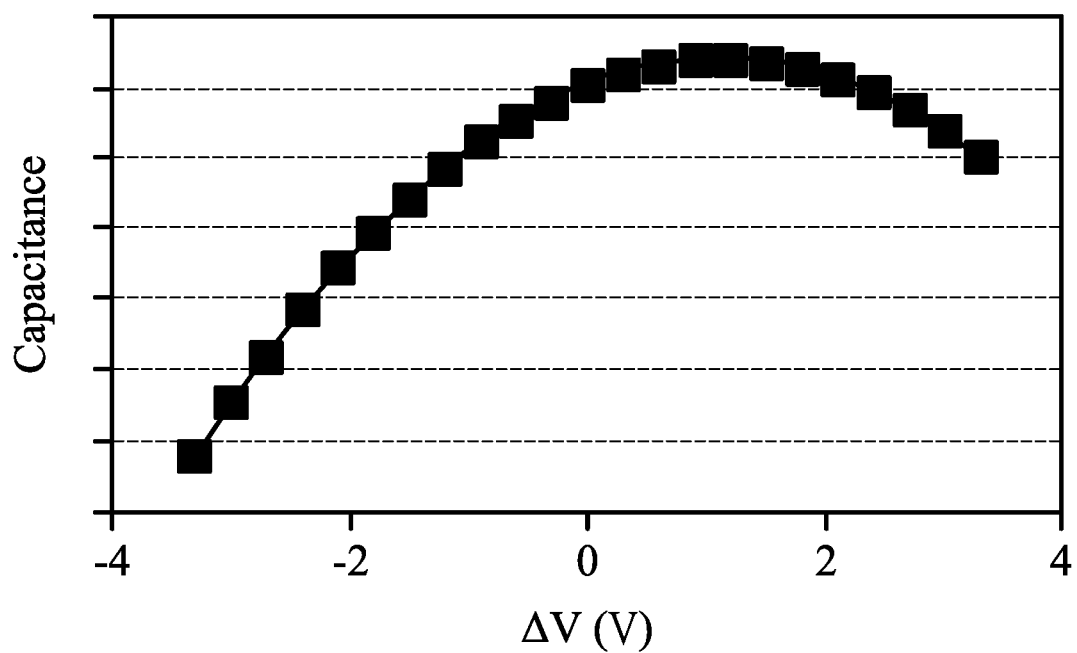
FIG. 4A shows the capacitance of a capacitor at different operation voltages, in accordance with some embodiments.

The capacitor dielectric layer with different materials may have different quadratic voltage coefficients. In some embodiments, the capacitor dielectric layer is an oxide material with compressive stress (such as silicon oxide with compressive stress). In these cases, the capacitor with the capacitor dielectric layer mentioned above has a negative quadratic voltage coefficient. FIG. 4A shows the capacitance of a capacitor at different operation voltages, in accordance with some embodiments. The quadratic voltage coefficient is negative.

Figure 4B:
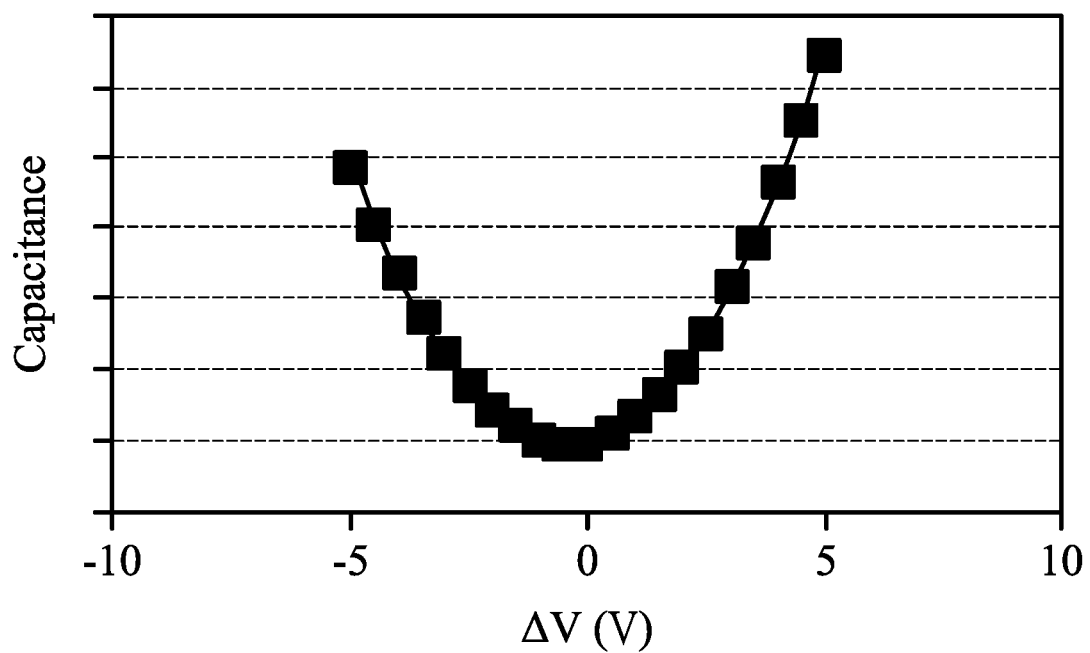
FIG. 4B shows the capacitance of a capacitor at different operation voltages, in accordance with some embodiments.

In some other embodiments, the capacitor dielectric layer is a nitride material with tensile stress (such as silicon nitride with tensile stress). In these cases, the capacitor with the capacitor dielectric layer mentioned above has a positive quadratic voltage coefficient. FIG. 4B shows the capacitance of a capacitor at different operation voltages, in accordance with some embodiments. The quadratic voltage coefficient is positive.

The material and/or stress of the capacitor dielectric layer may determine the linear temperature coefficient and the quadratic voltage coefficient of the capacitor. As mentioned above, in some embodiments, the capacitor dielectric layer 108 of the capacitor $C_1$ and the capacitor dielectric layer 114 of the capacitor $C_2$ are made of different materials. In some embodiments, the capacitor dielectric layer 108 is made of or includes an oxide material with compressive stress (such as silicon oxide with compressive stress), and the capacitor dielectric layer 114 is made of or includes a nitride material with tensile stress (such as silicon nitride with tensile stress). Accordingly, the capacitor $C_1$ has a negative linear temperature coefficient and/or a negative quadratic voltage coefficient. The capacitor $C_2$ has a positive linear temperature coefficient and/or a positive quadratic voltage coefficient.

In some embodiments, the capacitor $C_1$ has a negative linear temperature coefficient, and the capacitor $C_2$ has a positive linear temperature coefficient. A ratio of the linear temperature coefficient of the capacitor $C_1$ to the linear temperature coefficient of the capacitor $C_2$ is negative. Similar to those shown in FIGS. 3A and 3B, the capacitance of the capacitor $C_1$ may decreases as the operation temperature increases, and the capacitance of the capacitor $C_2$ may increases as the operation temperature increases. The capacitance of the capacitor $C_2$ may increase to compensate the capacitance loss of the capacitor $C_1$. In some other cases, if the operation temperature decreases, the capacitance of the capacitor $C_1$ may increase to compensate the capacitance loss of the capacitor $C_2$. Therefore, the total equivalent capacitance of the capacitors $C_1$ and $C_2$ may still be maintained. The reliability and performance of the semiconductor device structure may be maintained even if the operation conditions are changed.

In some embodiments, the capacitor $C_1$ has a negative quadratic voltage coefficient, and the capacitor $C_2$ has a positive quadratic voltage coefficient. A ratio of the quadratic voltage coefficient of the capacitor $C_1$ to the quadratic voltage coefficient of the capacitor $C_1$ is negative. Similar to those shown in FIGS. 4A and 4B, when the capacitor $C_1$ has a relatively high capacitance under a given operation voltage, the capacitor $C_2$ has a relatively low capacitance. When the capacitor $C_1$ has a relatively low capacitance under a given operation voltage, the capacitor $C_2$ has a relatively high capacitance. The capacitors $C_1$ and $C_2$ may compensate each other under different operation voltages. The reliability and performance of the semiconductor device structure may be maintained even if the operation conditions are changed.

Many variations and/or modifications can be made to embodiments of the disclosure. In some other embodiments, the capacitor dielectric layer 114 is made of or includes an oxide material with compressive stress (such as silicon oxide with compressive stress), and the capacitor dielectric layer 108 is made of or includes a nitride material with tensile stress (such as silicon nitride with tensile stress). Accordingly, the capacitor $C_2$ has a negative linear temperature coefficient and/or a negative quadratic voltage coefficient. The capacitor $C_1$ has a positive linear temperature coefficient and/or a positive quadratic voltage coefficient.

In some embodiments, each of the capacitor dielectric layers 108 and 114 is a single layer. However, embodiments of the disclosure are not limited thereto. Many variations and/or modifications can be made to embodiments of the disclosure. In some embodiments, at least one of the capacitor dielectric layers 108 and 114 has multiple sub-layers.

Figure 5:
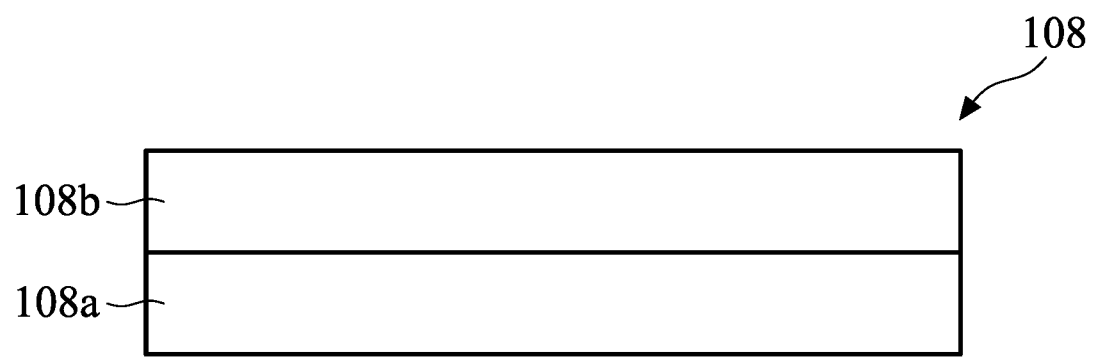
FIG. 5 is a cross-sectional view of a capacitor dielectric layer of a capacitor, in accordance with some embodiments.

FIG. 5 is a cross-sectional view of a capacitor dielectric layer of a capacitor, in accordance with some embodiments. In some embodiments, the capacitor dielectric layer 108 has multiple sub-layers. In some embodiments, the capacitor dielectric layer 108 has two sub-layers 108a and 108b. In some embodiments, the sub-layers 108a and 108b are made of different materials. In some embodiments, the sub-layer 108a is made of or includes an oxide material with compressive stress. In some embodiments, the sub-layer 108b is made of or includes a nitride material with tensile stress. In some other embodiments, the sub-layer 108a is made of or includes a nitride material with tensile stress. In some other embodiments, the sub-layer 108b is made of or includes an oxide material with compressive stress. The sub-layers 108a and 108b may compensate each other. Therefore, the reliability and performance of the semiconductor device structure may be maintained even if the operation conditions are changed. In some other embodiments, the sub-layers 108a and 108b are made of silicon oxynitride with different compositions. For example, the sub-layer 108a may have a greater atomic concentration of nitrogen than that if the sub-layer 108b. In some other embodiments, the sub-layers 108a and 108b are made of tantalum oxide with different compositions.

Figure 6:
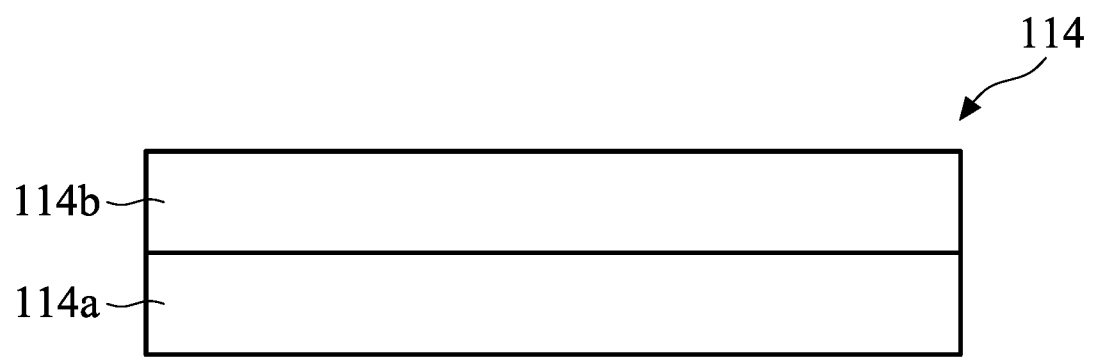
FIG. 6 is a cross-sectional view of a capacitor dielectric layer of a capacitor, in accordance with some embodiments.

FIG. 6 is a cross-sectional view of a capacitor dielectric layer of a capacitor, in accordance with some embodiments. In some embodiments, the capacitor dielectric layer 114 has multiple sub-layers including sub-layers 114a and 114b. In some embodiments, the sub-layers 114a and 114b are made of different materials. The sub-layers 114a and 114b may compensate each other. Therefore, the reliability and performance of the semiconductor device structure may be maintained even if the operation conditions are changed. In some embodiments, both of the capacitor dielectric layers 108 and 114 have multiple sub-layers.

Figure 7:
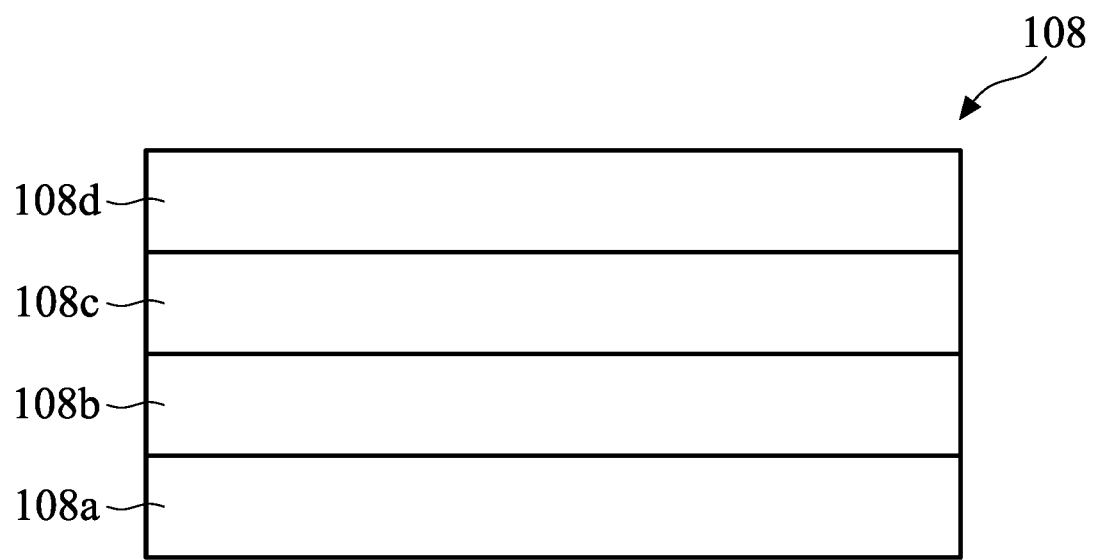
FIG. 7 is a cross-sectional view of a capacitor dielectric layer of a capacitor, in accordance with some embodiments.

FIG. 7 is a cross-sectional view of a capacitor dielectric layer of a capacitor, in accordance with some embodiments. In some embodiments, the capacitor dielectric layer 108 (or 114) of FIG. 1 has more than two sub-layers including sub-layers 108a, 108b, 108c, and 108d. In some embodiments, two or more of the sub-layers 108a-d are made of different materials. These sub-layers 108a-d may compensate each other. Therefore, the reliability and performance of the semiconductor device structure may be maintained even if the operation conditions are changed.

Many variations and/or modifications can be made to embodiments of the disclosure. In some embodiments, one or more of the conductive layers 104, 110, and 116 are formed to be have smaller average grain sizes. In some embodiments, the conductive layers 104, 110, and 116 are formed using a sputtering process. In some cases, the sputter power is about 2.7 kW, and the operation temperature is about 270 degrees C. However, the average grain size of the conductive layers 104, 110, and 116 obtained under the process conditions mentioned above may be as large as about 7.4 nm. In order to form conductive layers with smaller average grain sizes, the process conditions are fine-tuned. In some embodiments, a higher sputter power and a lower operation temperature are used to constrain the growth of grain in the conductive layers. In some embodiments, the sputter power is increased to be in a range from about 9 kW to about 15 kW and the operation temperature is reduced to be in a range from about 100 degrees C. to about 150 degrees C. In some embodiments, the conductive layers 104, 110, and 116 are cooled down right after the sputtering process. For example, a water cooling system is used to cool down the operation temperature more efficiently after the conductive layers 104, 110, and 116 are formed. Since the temperature of the conductive layers 104, 110, and 116 is reduced in a short time, the grain growths of the conductive layers 104, 110, and 116 are constrained. As a result, each or one of the formed conductive layers 104, 110, and 116 may have a smaller average grain size. In some embodiments, the average grain size is in a range from about 3.5 nm to about 6.5 nm. The average grain size may be measured using an atomic force microscope (AFM). The average grain size may be reduced further. In some embodiments, if the average grain size is reduced, the capacitor may have a greater breakdown voltage. For example, the breakdown voltage may be increased from about 25V to be in a range from about 27 V to about 28 V. The reliability and performance of the semiconductor device structure are therefore improved due to the smaller average grain size of the conductive layers 104, 110, and 116. In some other cases, if the average grain size of the conductive layer is greater than about 6.5 nm, the breakdown voltage may be low, such as about 25 V.

In some embodiments, the average grain size of the conductive layer is reduced from about 7.4 nm to about 6.1 nm. The corresponding breakdown voltage is increased from about 25V to be about 27 V to 28 V.

Many variations and/or modifications can be made to embodiments of the disclosure. In some embodiments, one or more of the barrier layers 106, 112, and 118 are formed to be have smaller average grain sizes. In some embodiments, the barrier layers 106, 112, and 118 are formed using a PVD process. The gas flow used in the PVD process is fine-tuned such that a barrier layer with smaller grain size may be formed. In some embodiments, a gas flow of nitrogen is increased to be, for example, 150 sccm. In some embodiments, no argon gas is used during the formation of the barrier layers 106, 112, and/or 118. As a result, each or one of the formed barrier layers 106, 112, and 118 may have a smaller average grain size. In some embodiments, the average grain size is in a range from about 0.5 nm to about 1.2 nm. The average grain size may be measured using an AFM. In some cases, by fine-tuning the process conditions for forming the barrier layers 106, 112, and 118, the average grain size may be reduced from about 1.78 nm to about 0.92 nm. In some embodiments, if the average grain size is reduced, the barrier layer may have a more uniform thickness. The capacitance mismatch between nearby capacitors may be reduced or prevented. The reliability and performance of the semiconductor device structure are therefore improved. In some other cases, if the average grain size of the barrier layer is greater than about 1.2 nm, the capacitance mismatch between nearby capacitors may be too high.

Embodiments of the disclosure form a semiconductor device structure with stacked capacitor elements which are electrically connected in parallel. By selecting capacitor dielectric layers with different materials, the capacitor elements may have different linear temperature coefficients and/or quadratic voltage coefficients. The capacitor elements may therefore compensate each other under different operation conditions. The total equivalent capacitance may still be substantially the same under different operation conditions (such as under different operation temperatures and/or different operation voltages). The reliability and performance of the semiconductor device structure may be maintained even if the operation conditions are changed.

In accordance with some embodiments, a semiconductor device structure is provided. The semiconductor device structure includes a semiconductor substrate and a first capacitor and a second capacitor over the semiconductor substrate. The first capacitor has a first capacitor dielectric layer, and the second capacitor has a second capacitor dielectric layer. The first capacitor dielectric layer is between the second capacitor dielectric layer and the semiconductor substrate. The first capacitor and the second capacitor are electrically connected in parallel. The first capacitor has a first linear temperature coefficient and a first quadratic voltage coefficient. The second capacitor has a second linear temperature coefficient and a second quadratic voltage coefficient. One or both of a first ratio of the first linear temperature coefficient to the second linear temperature coefficient and a second ratio of the first quadratic voltage coefficient to the second quadratic voltage coefficient is negative.

In accordance with some embodiments, a semiconductor device structure is provided. The semiconductor device structure includes a lower electrode over a semiconductor substrate. The semiconductor device structure also includes a first capacitor dielectric layer over the lower electrode and an intermediate electrode over the first capacitor dielectric layer. The semiconductor device structure further includes a second capacitor dielectric layer over the intermediate electrode. The second capacitor dielectric layer and the first capacitor dielectric layer are made of different materials. In addition, the semiconductor device structure includes an upper electrode over the second capacitor dielectric layer.

In accordance with some embodiments, a semiconductor device structure is provided. The semiconductor device structure includes a lower electrode over a semiconductor substrate. The semiconductor device structure also includes a first capacitor dielectric layer over the lower electrode and an intermediate electrode over the first capacitor dielectric layer. The semiconductor device structure further includes a second capacitor dielectric layer over the intermediate electrode. The second capacitor dielectric layer and the first capacitor dielectric layer are made of different materials. In addition, the semiconductor device structure includes an upper electrode over the second capacitor dielectric layer. The lower electrode, the first capacitor dielectric layer, and the intermediate electrode together form a first capacitor, and the intermediate electrode, the second capacitor dielectric layer, and the upper electrode together form a second capacitor. The first capacitor has a first linear temperature coefficient and a first quadratic voltage coefficient, and the second capacitor has a second linear temperature coefficient and a second quadratic voltage coefficient. One or both of a first ratio of the first linear temperature coefficient to the second linear temperature coefficient and a second ratio of the first quadratic voltage coefficient to the second quadratic voltage coefficient is negative.

In accordance with some embodiments, a method for forming a semiconductor device structure is provided. The method includes forming a lower conductive layer over a semiconductor substrate and forming a first capacitor dielectric layer over the lower conductive layer. The method also includes forming an intermediate conductive layer over the first capacitor dielectric layer and forming a second capacitor dielectric layer over the intermediate conductive layer. The second capacitor dielectric layer and the first capacitor dielectric layer are made of different materials. The method further includes forming an upper conductive layer over the second capacitor dielectric layer. One (or more) of the lower conductive layer, the intermediate conductive layer, and the upper conductive layer has an average grain size in a range from about 3.5 nm to about 6.5 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
    a semiconductor substrate; and
    a first capacitor and a second capacitor over the semiconductor substrate, wherein:
        the first capacitor has a first capacitor dielectric layer between a first conductive layer and a second conductive layer,
        the second capacitor has a second capacitor dielectric layer between the second conductive layer and a third conductive layer, and
        the first capacitor dielectric layer comprises a compressive stress and the second capacitor dielectric layer comprises a tensile stress.

2. The semiconductor device structure as claimed in claim 1, wherein the first capacitor dielectric layer comprises a nitride material, and the second capacitor dielectric layer comprises an oxide material.

3. The semiconductor device structure as claimed in claim 1, wherein the first capacitor dielectric layer comprises an oxide material that contributes to the compressive stress, and the second capacitor dielectric layer comprises a nitride material that contributes to the tensile stress.

4. The semiconductor device structure as claimed in claim 1, wherein at least one of the first capacitor dielectric layer and the second capacitor dielectric layer has multiple sub-layers, and at least two of the sub-layers are made of different materials.

5. The semiconductor device structure as claimed in claim 1:
    wherein the first conductive layer is between the semiconductor substrate and the first capacitor dielectric layer;
    wherein the second conductive layer is between the first capacitor dielectric layer and the second capacitor dielectric layer; and
    wherein the third conductive layer is over the second capacitor dielectric layer, wherein each of the first conductive layer, the second conductive layer and the third conductive layer serves as an electrode of the first capacitor or the second capacitor.

6. The semiconductor device structure as claimed in claim 1, wherein at least one of the first conductive layer, the second conductive layer, and the third conductive layer has an average grain size that is in a range from about 3.5 nm to about 6.5 nm.

7. The semiconductor device structure as claimed in claim 1, further comprising:
    a first barrier layer between the first conductive layer and the first capacitor dielectric layer;
    a second barrier layer between the second conductive layer and the second capacitor dielectric layer; and
    a third barrier layer over the third conductive layer.

8. The semiconductor device structure as claimed in claim 1,
    wherein the first capacitor and the second capacitor are electrically connected in parallel;
    wherein the first capacitor has a first linear temperature coefficient and a first quadratic voltage coefficient;
    wherein the second capacitor has a second linear temperature coefficient and a second quadratic voltage coefficient; and
    wherein at least one of a first ratio of the first linear temperature coefficient to the second linear temperature coefficient and a second ratio of the first quadratic voltage coefficient to the second quadratic voltage coefficient is negative.

9. The semiconductor device structure as claimed in claim 1, further comprising:
    a first conductive structure disposed on an upper surface of the first conductive layer and laterally outside of an outermost boundary of the second conductive layer;
    a second conductive structure disposed on an upper surface of the second conductive layer and laterally outside of an outermost boundary of the third conductive layer; and
    a third conductive structure disposed on an upper surface of the third conductive layer and directly over the second conductive layer.

10. A semiconductor device structure, comprising:
    a lower electrode over a semiconductor substrate;
    a first capacitor dielectric layer over the lower electrode;
    an intermediate electrode over the first capacitor dielectric layer;
    a second capacitor dielectric layer over the intermediate electrode, wherein the second capacitor dielectric layer and the first capacitor dielectric layer are made of different materials;
    an upper electrode having a lower surface directly over an upper surface of the second capacitor dielectric layer and completely confined over the intermediate electrode;
    a first protection layer covering a sidewall of the upper electrode;
    a second protection layer covering a sidewall of the intermediate electrode and the first protection layer; and
    wherein the lower electrode, the first capacitor dielectric layer, and the intermediate electrode together form a first capacitor, and wherein the intermediate electrode, the second capacitor dielectric layer, and the upper electrode together form a second capacitor.

11. The semiconductor device structure as claimed in claim 10, wherein the first capacitor dielectric layer has compressive stress, and the second capacitor dielectric layer has tensile stress.

12. The semiconductor device structure as claimed in claim 10, wherein the first capacitor dielectric layer has tensile stress, and the second capacitor dielectric layer has compressive stress.

13. The semiconductor device structure as claimed in claim 10,
    wherein the upper electrode has a first maximum width extending between outermost sidewalls of the upper electrode; and
    wherein the first maximum width is less than a second maximum width extending between outermost sidewalls of the intermediate electrode.

14. The semiconductor device structure as claimed in claim 10, further comprising:
- a first conductive structure electrically connected to the lower electrode;
- a second conductive structure electrically connected to the intermediate electrode;
- a third conductive structure electrically connected to the upper electrode; and
- a fourth conductive structure electrically connected to the first conductive structure and the third conductive structure.

15. The semiconductor device structure as claimed in claim 10, wherein the first protection layer is in direct contact with the upper electrode and the second capacitor dielectric layer.

16. The semiconductor device structure as claimed in claim 15, wherein the second protection layer is in direct contact with the first capacitor dielectric layer, the lower electrode, and the first protection layer.

17. A method for forming a semiconductor device structure, comprising:
- forming a lower conductive layer over a semiconductor substrate;
- forming a first capacitor dielectric layer over the lower conductive layer;
- forming an intermediate conductive layer over the first capacitor dielectric layer;
- forming a second capacitor dielectric layer over the intermediate conductive layer, wherein the second capacitor dielectric layer and the first capacitor dielectric layer are made of different materials and wherein the first capacitor dielectric layer has a first type of mechanical stress and the second capacitor dielectric layer has a second type of mechanical stress that is different than the first type of mechanical stress; and
- forming an upper conductive layer over the second capacitor dielectric layer,
- wherein the intermediate conductive layer is formed by patterning a conductive material according to a mask comprising the upper conductive layer.

18. The method for forming a semiconductor device structure as claimed in claim 17, wherein the first capacitor dielectric layer is formed to have a plurality of sub-layers of different materials.

19. The method for forming a semiconductor device structure as claimed in claim 17, wherein the lower conductive layer, the intermediate conductive layer, and the upper conductive layer are formed using sputtering processes, at least one of the sputtering processes is performed at an operation temperature in a range from about 100 degrees C. to about 150 degrees C., and the method further comprises:
- cooling the lower conductive layer, the intermediate conductive layer, and the upper conductive layer right after the lower conductive layer, the intermediate conductive layer, and the upper conductive layer are formed.

20. The method for forming a semiconductor device structure as claimed in claim 19, further comprising:
- using a water cooling system to cool the lower conductive layer, the intermediate conductive layer, and the upper conductive layer right after the lower conductive layer, the intermediate conductive layer, and the upper conductive layer are formed.

* * * * *